United States Patent [19]

Payne

[11] Patent Number: 4,514,022
[45] Date of Patent: Apr. 30, 1985

[54] PROBE CABLE ASSEMBLIES

[75] Inventor: David G. Payne, Aloha, Oreg.

[73] Assignee: Tektronix, Inc., Beaverton, Oreg.

[21] Appl. No.: 509,827

[22] Filed: Jun. 29, 1983

[51] Int. Cl.³ .................... H01R 23/72; H01L 21/66
[52] U.S. Cl. ........................... 339/17 F; 324/158 P;
                                        339/28; 339/176 MF
[58] Field of Search .............. 324/158 F, 158 P;
              339/17 CF, 17 F, 108 TP, 176 MF, 28

[56] References Cited

U.S. PATENT DOCUMENTS

| 3,805,213 | 4/1974  | Austin ........................ 339/17 F     |
| 4,018,491 | 4/1977  | Niedzwiecke ........... 339/176 MF X |
| 4,065,199 | 12/1977 | Andre et al. ............... 339/17 F     |
| 4,141,614 | 2/1979  | Piccirillo .................... 339/17 F     |
| 4,460,224 | 7/1984  | Stopper ....................... 339/17 F     |

FOREIGN PATENT DOCUMENTS

| 148436     | 11/1980 | Japan ........................... 324/158 F |
| WO80/00101 | 1/1980  | PCT Int'l Appl. ............. 324/158 P |

OTHER PUBLICATIONS

B. Best et al., "Flexible Probe", *IBM Tech. Disclosure Bulletin*, vol. 15, No. 11, (Apr. 1973), pp. 3428–3429.

*Primary Examiner*—John McQuade
*Assistant Examiner*—Steven C. Bishop
*Attorney, Agent, or Firm*—John Smith-Hill

[57] ABSTRACT

A probe cable assembly for use in connecting a monitoring instrument to an electronic system under test comprises a sheet form cable having an instrument end, a probe end and an auxiliary interconnect end. A probe element having a plurality of terminals is secured to the cable at the probe end thereof and is capable of fitting in a multiple terminal receptacle of the system under test. An auxiliary receptacle capable of receiving a multiple terminal electronic component from the system under test and having a plurality of terminals is also secured to the cable. A first group of conductors of the cable extends between the instrument end of the cable and the auxiliary interconnect end and terminates at the auxiliary interconnect end in an array corresponding to the arrangement of the terminals of the auxiliary receptacle. A second group of conductors extends between the terminals of the auxiliary receptacle and corresponding terminals of said probe element. The cable is folded to bring the terminations of the first group of conductors into registry with the terminals of the auxiliary receptacle so that conductors of the first group are connected both to predetermined terminals of the auxiliary receptacle and to corresponding terminals of the probe element.

2 Claims, 6 Drawing Figures

PROBE CABLE ASSEMBLIES

This invention relates to probe cable assemblies.

BACKGROUND OF THE INVENTION

It is well known to use a logic analyzer in the design of a microprocessor-based system. A conventional logic analyzer is used to display the system's response to various operations performed by the microprocessor, and to change the mode of operation of the microprocessor. The microprocessor interfaces with the logic analyzer through a personality module. Conventionally, the personality module has a probe cable which connects the module to the system under test, by way of the microprocessor's connection terminals. Recent microprocessors have as many as 68 closely spaced terminals, and it is extremely difficult to establish separate connections to the 68 different terminals, particularly in the case where the terminals are not leads projecting from the microprocessor housing but are pads which are essentially flush with the housing. Nevertheless, it is at least theoretically possible for the microprocessor to remain in its socket in the system under test. However, in some cases, for example the Intel 80186 and 80188 microprocessors, the microprocessor has two distinct operating modes, and it may be desired under some circumstances for the microprocessor to operate in mode 2 yet be perceived by the system under test to be operating in mode 1. This implies that the microprocessor must be removed from the system under test and provision made to connect both the personality module and the microprocessor to the system under test through the system's microprocessor socket. It will be appreciated that this involves many more conductors and connections then the number of terminals of the microprocessor.

SUMMARY OF THE INVENTION

According to the present invention there is provided a probe cable assembly for use in connecting a monitoring instrument to an electronic system under test, which system has a receptacle for receiving a multiple terminal electronic component, to analyze the interaction between the system and the component, said cable assembly comprising a flexible circuit cable having an instrument end, a probe end and an auxiliary interconnect end, a probe element secured to the cable at the probe end thereof and capable of fitting in the receptacle of the system under test, said probe element having a plurality of terminals, and an auxiliary receptacle for receiving the multiple terminal electronic component and having a plurality of terminals in a predetermined array, and said cable comprising a plurality of conductors supported by a dielectric matrix, a first group of said conductors extending between said instrument end of the cable and the auxiliary interconnect end and terminating at said auxiliary interconnect end in an array corresponding to said predetermined array, and a second group of said conductors extending between the terminals of the auxiliary receptacle and corresponding terminals of said probe element, the cable being folded to bring the terminations of the first group of conductors into registry with the terminals of the auxiliary receptacle so that conductors of the first group are connected both to predetermined terminals of the auxiliary receptacle and to corresponding terminals of the probe element.

BRIEF DESCRIPTION OF THE DRAWINGS

For a better understanding of the invention, and to show how the same may be carried into effect, reference will now be made, by way of example, to the accompanying drawings in which.

DETAILED DESCRIPTION

Figure 1:
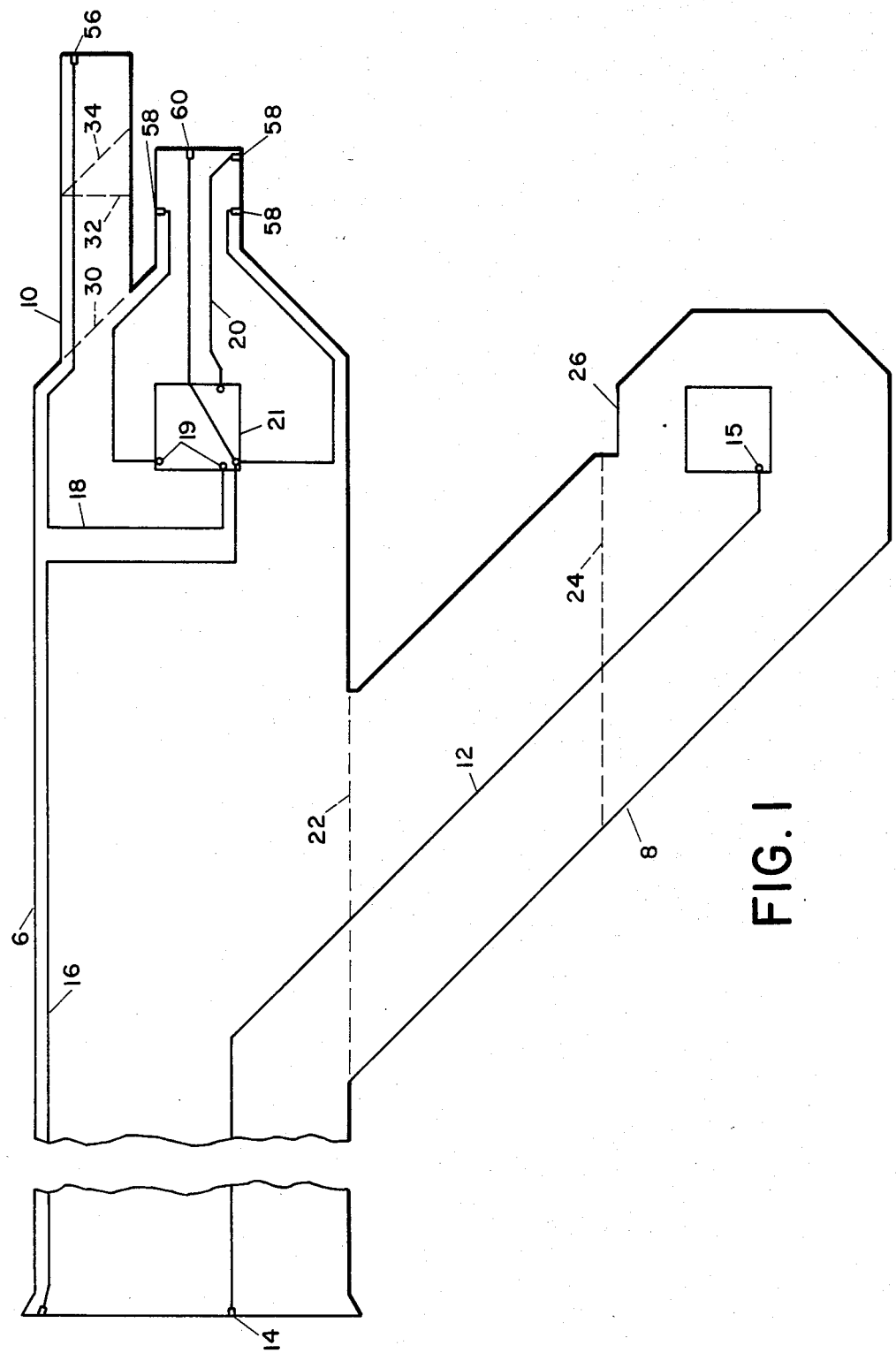
FIG. 1 is a bottom plan view of a flexible circuit cable.
Figure 2:
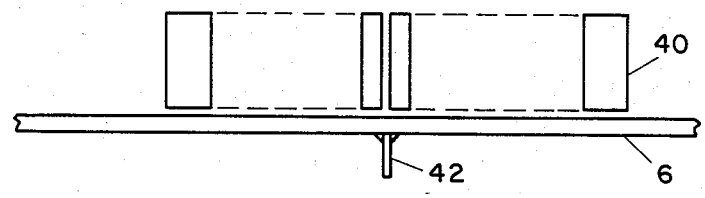
FIG. 2 is an enlarged, simplified, fragmentary side elevation of a part of the cable and a microprocessor chip socket during manufacture of a probe cable assembly.
Figure 3:
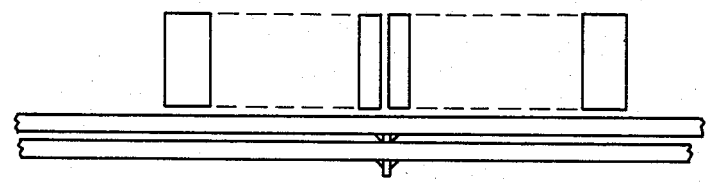
FIG. 3 is a view similar to FIG. 2 at a later stage in manufacture of the cable assembly.

The flexible cable illustrated in FIG. 1 is formed by a single layer flexible circuit board comprising a substrate of insulating material having a plurality of conductors supported thereon and covered by a thin layer of insulating material. The cable is in three main portions, namely a main body portion 6 and two leg portions 8 and 10. The conductors form four main groups, representative conductors of which are shown. The conductors of the first group 12 extend from a connector 14 at one end of the main body portion of the cable and terminate in connection pads 15 distributed in a square array at the end of the leg portion 8 and exposed at the underside of the board. The conductors of the second group 16 extend from the connector 14 to the opposite end of the main body 6. The conductors of the third group 18 extend from exposed connection pads 19 distributed in a square array at a chip support area 21 intermediate the ends of the main body portion 6 to the end of the leg portion 10, while the conductors of the fourth group 20 extend from that same area to the end of the main body portion 6.

Figure 4:
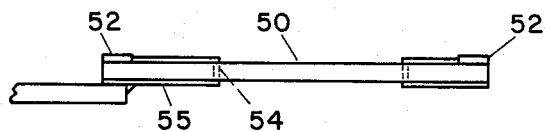
FIG. 4 is an enlarged simplified, fragmentary side elevation of a second part of the cable during manufacture of the cable assembly.
Figure 5:
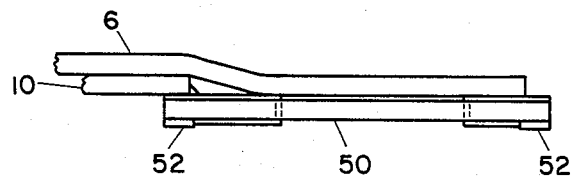
FIG. 5 is a view similar to FIG. 4 at a later stage in manufacture of the cable assembly.
Figure 6:
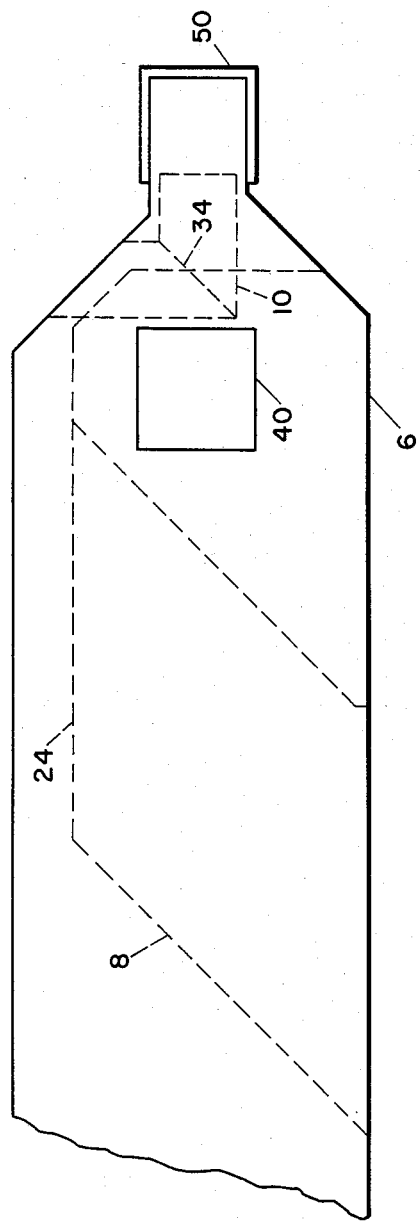
FIG. 6 is a plan view of the finished probe cable assembly.

Each of the connection pads 15 and 19 is annular in form, surrounding an aperture in the flexible cable. The cable is oriented with the exposed connection pads at its underside. A chip carrier socket 40, having terminals (not shown) arranged to engage the terminals of a leadless microprocessor chip and having contact pins 42 associated with the terminals and arranged in a square array corresponding to the arrays of connection pads 15 and 19, is mounted to the main body portion 6 by inserting its pins through the apertures in the body portion 6. The pins are soldered to the exposed connection pads 19. The leg portion 8 is folded twice, along fold lines 22 and 24, and its end 26 is placed in contact with the main body portion 6 at the underside thereof. The connection pads 15 register with the connection pads 19, and the end 26 of the leg portion 8 is pushed onto the pins 42 so that the pins pass through the apertures in the end 26, and the pins are soldered to the exposed pads 15, making electrical contact with the ends of the conductors 12. Similarly, a generally square probe element 50 (FIG. 4) which is configured to fit in a socket identical to the socket 40 has contact pads 52 at its underside which are connected to the conductors of the groups 16, 18 and 20. Thus, the pads 52 are connected through vias 54 to contact runs 55 on the upper side of the element 50, and the element 50 is inverted and placed over the terminations 56 of the conductors of the group 16 at the end of the leg portion 10. The runs 55 along one edge of the element 50 are soldered to the terminations 56. The leg portion 10 is folded along the three fold lines 30, 32 and 36 and is thus inverted and placed beneath the end of the main body portion 6, and the runs 54 along the other three edges of the element 50 are soldered to the terminations 58 and 60 of the conductors of the groups 16 and 20. The probe end of the resulting probe cable assembly is shown in simplified form in FIG. 6.

In use of the probe cable assembly, the terminals 14 of the cable are used to connect the cable to the personality module of a logic analyzer. The microprocessor is removed from its socket in the system under test, and is fitted in the socket 40, and the probe element 50 is fitted in the microprocessor socket of the system under test. It will be appreciated that the connections made by the pins of the socket 40 to the conductors 18 and 20 result in the microprocessor's being situated electrically within the system under the test yet the personality module is also connected directly to the system under test through the conductors 16. The folding of the legs 8 and 10 allows a high density of conductors to be achieved in the vicinity of the socket 40 and the probe element 50 without use of a multiple layer flexible circuit.

The invention is not restricted to the particular probe cable assemble which has been described and illustrated, since variations may be made therein without departing from the scope of the invention as defined in the appended claims and equivalents thereof.

I claim:

1. A probe cable assembly for use in connecting a monitoring instrument to an electronic system under test, which system has a receptacle for receiving a multiple terminal electronic component, to analyze the interaction between the system and the component, said cable assembly comprising a flexible circuit cable having an instrument end, a probe end and an auxiliary interconnect end, a probe element secured to the cable at the probe end thereof and capable of fitting in the receptacle of the system under test, said probe element having a plurality of terminals, and an auxiliary receptacle for receiving the multiple terminal electronic component said auxiliary receptacle being secured to the cable and having a plurality of terminals in a predetermined array, and said cable comprising a plurality of conductors supported by a dielectric matrix, a first group of said conductors extending between said instrument end of the cable and the auxiliary interconnect end and terminating at said auxiliary interconnect end in an array corresponding to said predetermined array, and a second group of said conductors extending between the terminals of the auxiliary receptacle and corresponding terminals of said probe element, the cable being folded to bring the terminations of the first group of conductors into registry with the terminals of the auxiliary receptacle so that conductors of the first group are connected both to predetermined terminals of the auxiliary receptacle and to corresponding terminals of the probe element.

2. An assembly according to claim 1, wherein the cable comprises at its probe end, first and second leg portions, said first leg portion having first and second sides that are parallel to each other and a third side that is disposed at right angles to the first and second sides, and said second leg portion having a side substantially equal in length to said third side, said second group of conductors including conductors that terminate on each of said first, second and third sides of the first leg portion and on said side of the second leg portion, at least one of said leg portions being folded to position said side of the second leg portion parallel to and spaced from said third side of the first leg portion, whereby the terminations of the second group of conductors at the probe end of the cable are disposed in a generally rectangular array.

* * * * *